(12) United States Patent
Dambrauskas (10) Patent No.: US 7,402,501 B2
(45) Date of Patent: Jul. 22, 2008

(54) METHOD OF MANUFACTURING A COAXIAL TRACE IN A SURROUNDING MATERIAL, COAXIAL TRACE FORMED THEREBY, AND SEMICONDUCTING MATERIAL CONTAINING SAME

(75) Inventor: Tony Dambrauskas, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 148 days.

(21) Appl. No.: 11/429,292

(22) Filed: May 4, 2006

(65) Prior Publication Data

US 2007/0257338 A1 Nov. 8, 2007

(51) Int. Cl.
*H01L 21/46* (2006.01)
(52) U.S. Cl. .................. 438/455; 438/42; 438/456; 438/700; 257/E21.122
(58) Field of Classification Search .................. 438/42, 438/44; 257/E21.48
See application file for complete search history.

(56) References Cited

U.S. PATENT DOCUMENTS 4,602,318 A * 7/1986 Lassen ........................ 361/792
2005/0136634 A1* 6/2005 Savastiouk et al. .......... 438/597

* cited by examiner

*Primary Examiner*—Michael S. Lebentritt
*Assistant Examiner*—Cheung Lee
(74) *Attorney, Agent, or Firm*—Kenneth A. Nelson (57) ABSTRACT

A method of manufacturing a coaxial trace (100) within a surrounding material (190) includes: providing a first substrate (191, 410) and a second substrate (192, 1010) composed of the surrounding material; forming a first portion (101, 601) of the coaxial trace in the first substrate; forming a second portion (102, 1001) of the coaxial trace in the second substrate; aligning the first portion of the coaxial trace with the second portion of the coaxial trace; and bonding the first portion of the coaxial trace to the second portion of the coaxial trace.

22 Claims, 5 Drawing Sheets

METHOD OF MANUFACTURING A COAXIAL TRACE IN A SURROUNDING MATERIAL, COAXIAL TRACE FORMED THEREBY, AND SEMICONDUCTING MATERIAL CONTAINING SAME

FIELD OF THE INVENTION

This invention relates generally to signal transmission, and relates more particularly to the formation of coaxial traces for the transmission of electrical signals.

BACKGROUND OF THE INVENTION

Coaxial cables or traces are commonly used to carry radio signals, video signals, measurement and data signals, and the like. A typical coaxial cable comprises two conductive channels arranged along a single axis and separated by a layer of insulating material. The conductive channels and the insulating layer are enclosed within a second insulating layer. Typically, the inner conductive layer carries the signal and the outer conductive layer serves as a grounding layer.

In semiconductor applications signals must often be shielded so they do not interfere with separate transmissions or other activities taking place elsewhere. Coaxial traces are ideal, and often required, for transmitting shielded signals, yet no method for manufacturing coaxial cable within semiconducting substrates currently exists. Signal transmission in semiconductors is presently accomplished using bulky wiring solutions external to the silicon or other semiconducting material. Signal traces embedded in a semiconducting substrate would be less bulky and would be well suited to stackable packaging solutions. Accordingly, there exists a need for a method of manufacturing signal traces, including coaxial traces, within a semiconducting or other surrounding material.

BRIEF DESCRIPTION OF THE DRAWINGS

The invention will be better understood from a reading of the following detailed description, taken in conjunction with the accompanying figures in the drawings in which.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner.

DETAILED DESCRIPTION OF THE DRAWINGS

In one embodiment of the invention, a method of manufacturing a coaxial trace within a surrounding material comprises: providing first and second substrates composed of the surrounding material; forming a first portion of the coaxial trace in the first substrate; forming a second portion of the coaxial trace in the second substrate; aligning the first portion of the coaxial trace with the second portion of the coaxial trace; and bonding the first portion of the coaxial trace to the second portion of the coaxial trace.

The ability to manufacture a coaxial trace within silicon or another surrounding material, among other possible advantages, reduces the amount of vertical bulk in a semiconductor package, allows a greater degree of die stacking within semiconductor packages, and decreases signal path length (thereby increasing transmission efficiency). Described below is a method (and structure resulting therefrom) of manufacturing a coaxial trace within a surrounding material in which the coaxial trace is formed in two portions that are then bonded together. The described manufacturing method, in at least one embodiment, allows for coaxial traces to be made on silicon or other semiconducting substrates so as to enable signal flow to processes on die.

Figure 1:
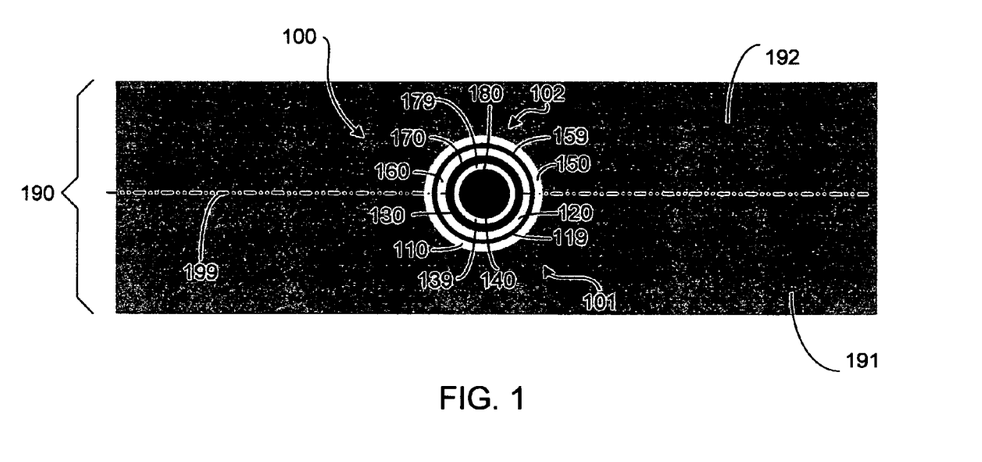
FIG. 1 is a cross sectional view of a coaxial trace embedded within a semiconducting substrate according to an embodiment of the invention.

Referring now to the figures, FIG. 1 is a cross sectional view of a coaxial trace 100 embedded within a semiconducting substrate 190 according to an embodiment of the invention. As illustrated in FIG. 1, coaxial trace 100 comprises a layer 110 of electrically insulating material, a seed layer 119 interior to layer 110, a layer 120 of electrically conducting material interior to layer 119, a layer 130 of electrically insulating material interior to layer 120, a seed layer 139 interior to layer 130, and a layer 140 of electrically conducting material interior to layer 139. Either or both of layers 120 and 140 of electrically conducting material could be a laminate of sputtered metals in order to provide adhesion and flexibility. Alternatively, the conductive material could be electroplated on top of the seed layer. Each of layers 110, 119, 120, 130, 139, and 140 are embedded within semiconducting substrate 190.

In one embodiment, semiconducting substrate 190 is made of silicon or the like. In the same or another embodiment, one or both of layers 110 and 130 are made of silicon dioxide or the like. In the same or another embodiment, one or both of layers 120 and 140 are made of copper, another metal, or the like. In the same or another embodiment, one or both of seed layers 119 and 139 are made of titanium, titanium nitride, tantalum, tantalum nitride, tungsten, another refractory metal like the foregoing but not explicitly mentioned, or a similar material. Seed layers 119 and 139 are formed in order to create a surface to which the electrically conducting layers will adhere. Copper, for example, exhibits good adhesion with titanium and the other seed layer materials mentioned above but exhibits rather poor adhesion with silicon dioxide and other materials that may be used in the electrically insulating layers.

Semiconducting substrate 190 comprises a section 191 and a section 192 that are bonded to each other along a bond line 199. Section 191 of semiconducting substrate 190 contains a portion 101 of coaxial trace 100 and section 192 of semiconducting substrate 190 contains a portion 102 of coaxial trace 100. As mentioned above and as described in greater detail below, portions 101 and 102 of coaxial trace 100 may be manufactured separately and then bonded together to form a complete coaxial trace.

Referring still to FIG. 1, portion 101 of coaxial trace 100 comprises layers 110, 119, 120, 130, 139, and 140 that were described previously. Similarly, portion 102 of coaxial trace 100 comprises a layer 150 of electrically insulating material, a seed layer 159 interior to layer 150, a layer 160 of electrically conducting material interior to layer 159, a layer 170 of electrically insulating material interior to layer 160, a seed layer 179 interior to layer 170, and a layer 180 of electrically conducting material interior to layer 179. As was the case with layers 110, 119, 120, 130, 139, and 140, each of layers 150, 159, 160, 170, 179, and 180 are embedded within semiconducting substrate 190. Furthermore, layers 150, 159, 160, 170, 179, and 180 can be similar to, respectively, layers 110, 119, 120, 130, 139, and 140.

In one embodiment, portion 101 comprises a first half, or substantially half, of coaxial trace 100 and portion 102 comprises a second half, or substantially half, of coaxial trace 100. As alluded to above, and as will be discussed in more detail below, in one embodiment each half of coaxial trace 100 is formed separately, and the halves are later bonded together. In that embodiment, section 102 may be positioned over section 101 and then lowered into an adjacent position such that the two halves may be joined to each other. Alternatively, section 101 may be raised toward section 102. Furthermore, the relative positions of sections 101 and 102 may be reversed and/or other changes to the process may be made that lead to the same or a similar end result.

Figure 2:
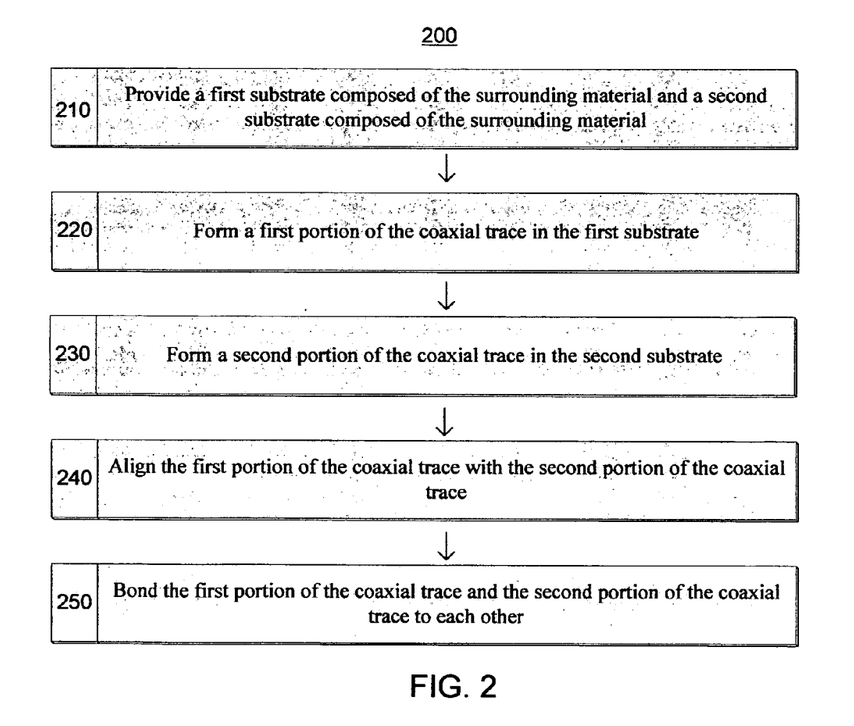
FIG. 2 is a flowchart illustrating a method of manufacturing a coaxial trace within a surrounding material according to an embodiment of the invention.

FIG. 2 is a flowchart illustrating a method 200 of manufacturing a coaxial trace, such as coaxial trace 100, within a surrounding material according to an embodiment of the invention. A step 210 of method 200 is to provide a first substrate composed of the surrounding material and a second substrate composed of the surrounding material. As an example, the surrounding material can be a semiconducting substrate, such as silicon. As another example, the surrounding material can be glass or a similar substance.

The first and second substrates can be thought of either as separate substrates or as separate pieces or portions of a single substrate. As an example, the first substrate can be similar to section 191 of semiconducting substrate 190 and the second substrate can be similar to section 192 of semiconducting substrate 190. Section 191, section 192, and semiconducting substrate 190 are all shown in FIG. 1.

A step 220 of method 200 is to form a first portion of the coaxial trace in the first substrate. As an example, the first portion of the coaxial trace can be similar to portion 101 of coaxial trace 100, both of which are shown in FIG. 1. In one embodiment, step 220 comprises: forming a first electrically insulating layer in the first substrate; forming a first electrically conducting layer interior to the first electrically insulating layer; forming a second electrically insulating layer interior to the first electrically conducting layer; and forming a second electrically conducting layer interior to the second electrically insulating layer. As an example, the first and second electrically insulating layers and the first and second electrically conducting layers can be similar to, respectively, layers 110 and 130 of electrically insulating material and layers 120 and 140 of electrically conducting material, all of which were first shown in FIG. 1.

In the same embodiment as that described in the previous paragraph, or in a different embodiment, step 220 may further comprise forming a first seed layer after forming the first electrically insulating layer and prior to forming the first electrically conducting layer, and may still further comprise forming a second seed layer after forming the second electrically insulating layer and prior to forming the second electrically conducting layer. As an example, the first seed layer and the second seed layer can be similar to, respectively, seed layers 119 and 139, both of which were first shown in FIG. 1.

A step 230 of method 200 is to form a second portion of the coaxial trace in the second substrate. As an example, the second portion of the coaxial trace can be similar to portion 102 of coaxial trace 100, both of which are shown in FIG. 1. In one embodiment, steps 220 and 230 can be performed simultaneously or substantially simultaneously. In another embodiment, steps 220 and 230 can be performed sequentially. In the same or another embodiment, step 230 comprises: forming a third electrically insulating layer in the second substrate; forming a third electrically conducting layer interior to the third electrically insulating layer; forming a fourth electrically insulating layer interior to the third electrically conducting layer; and forming a fourth electrically conducting layer interior to the fourth electrically insulating layer. As an example, the third and fourth electrically insulating layers and the third and fourth electrically conducting layers can be similar to, respectively, layers 150 and 170 of electrically insulating material and layers 160 and 180 of electrically conducting material, all of which were first shown in FIG. 1.

In the same embodiment as that described in the previous paragraph, or in a different embodiment, step 230 may further comprise forming a third seed layer after forming the third electrically insulating layer and prior to forming the third electrically conducting layer, and may still further comprise forming a fourth seed layer after forming the fourth electrically insulating layer and prior to forming the fourth electrically conducting layer. As an example, the third seed layer and the fourth seed layer can be similar to, respectively, seed layers 159 and 179, both of which were first shown in FIG. 1.

A step 240 of method 200 is to align the first portion of the coaxial trace with the second portion of the coaxial trace. In one embodiment, step 240 comprises inverting one of the first portion and the second portion with respect to the other one of the first portion and the second portion to create an inverted portion and a non-inverted portion, and placing the inverted portion above the non-inverted portion such that a feature of the inverted portion is aligned with a corresponding feature of the non-inverted portion.

A step 250 of method 200 is to bond the first portion of the coaxial trace and the second portion of the coaxial trace to each other. In an embodiment where the surrounding material is glass, step 250 can be an anodic bonding step. In an embodiment where the surrounding material is silicon, the first portion and the second portion of the coaxial trace can be bonded together using silicon-silicon direct bonding. As an example, in order to facilitate the initial phase of direct silicon bonding, (i.e., the creation of Van der Waals bonds), without compromising the integrity of the coaxial trace, gas plasma oxidation, such as with oxygen, argon, or the like, may be used rather than sulfuric acid, hydrogen peroxide, or the like.

In the same or another embodiment, step 250 further comprises one or more of: fusing the first electrically insulating layer to the third electrically insulating layer; fusing the first seed layer to the third seed layer; fusing the first electrically conducting layer to the third electrically conducting layer; fusing the second electrically insulating layer to the fourth electrically insulating layer; fusing the second seed layer to the fourth seed layer; and fusing the second electrically conducting layer to the fourth electrically conducting layer. In a particular embodiment, step 250 still further comprises fusing the first substrate to the second substrate. As an example, the silicon, the electrically insulating layers, the seed layers, and/or the electrically conducting layers can be fused to each other using an anneal process. As a particular example, the anneal can take place at relatively low temperatures, such as approximately 250 degrees Celsius so as to allow for greater flexibility in earlier temperature-sensitive processing steps, or at relatively higher temperatures, such as in a range of approximately 800 to 1000 degrees Celsius.

Figure 3:
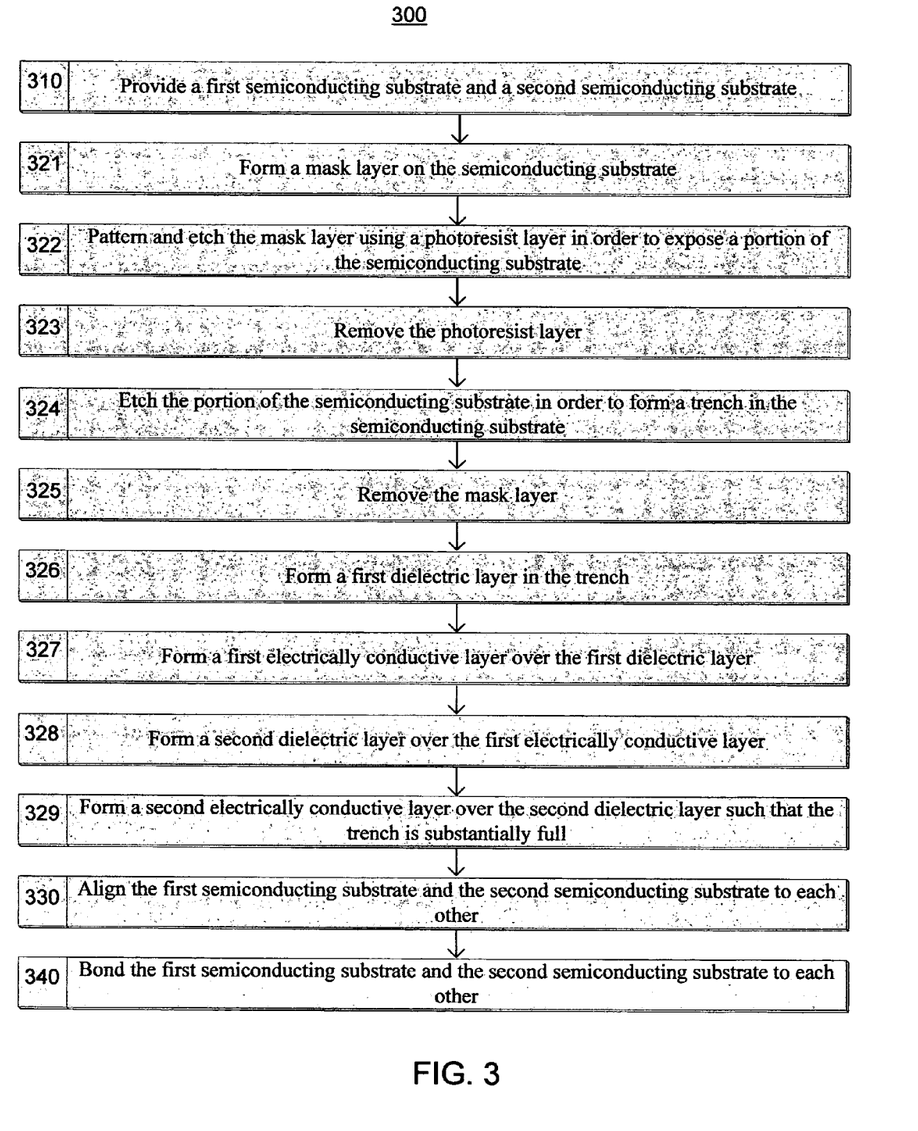
FIG. 3 is a flowchart illustrating a method of manufacturing a coaxial trace in a semiconducting material according to an embodiment of the invention.

FIG. 3 is a flowchart illustrating a method 300 of manufacturing a coaxial trace in a semiconducting material according to an embodiment of the invention. Method 300 and FIG. 3 include steps that are or may be optimized for a coaxial trace that is manufactured in a surrounding material of silicon. Coaxial traces may be manufactured according to other embodiments of the invention within other surrounding materials by modifying the steps of method 300. For purposes and simplicity and clarity, seed layers, such as those corresponding to seed layers 119, 139, 159, and 179, are not depicted in the figures that are described in connection with method 300 (FIGS. 4-10). Such seed layers will, however, be discussed as part of the discussion of method 300 in the following paragraphs.

A step 310 of method 300 is to provide a first semiconducting substrate and a second semiconducting substrate. As an example, the first semiconducting substrate and/or the second semiconducting substrate can be similar to portion 191 of semiconducting substrate 190, both of which were first shown in FIG. 1. As another example, the first semiconducting substrate and/or the second semiconducting substrate can be similar to a semiconducting substrate 410, first shown in FIG. 4.

Figure 4:
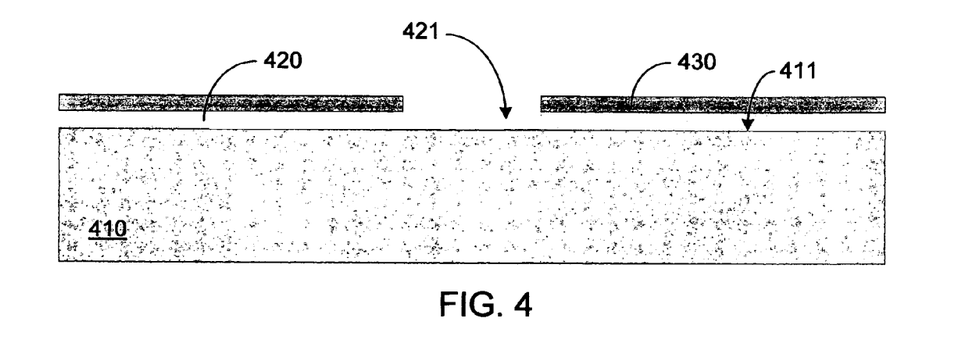
FIG. 4 is a cross sectional view, depicting a particular point in a manufacturing process, of an environment useful in the manufacture of a portion of a coaxial trace according to an embodiment of the invention.

FIG. 4 is a cross sectional view, depicting a particular point in the manufacturing process of method 300, of an environment useful in the manufacture of a coaxial trace according to an embodiment of the invention. As mentioned above, FIG. 4 illustrates semiconducting substrate 410, which can be similar to semiconducting substrate 190 that was shown in FIG. 1. Accordingly, in one embodiment, step 310 comprises forming or providing a silicon substrate. As depicted in FIG. 4, semiconducting substrate 410 has a surface 411.

Steps 321, 322, 323, 324, 325, 326, 327, 328, and 329, all of which will be discussed in the following paragraphs, are performed for both the first semiconducting substrate and the second semiconducting substrate. FIGS. 4-9, however, depict only one of the first and second semiconducting substrates. (FIG. 10, in contrast to FIGS. 4-9 but like FIG. 1, depicts both the first and the second semiconducting substrates.) In one embodiment, one or more of steps 321 through 329 are performed simultaneously for both the first and second semiconducting substrates. In another embodiment, some or all of steps 321 through 329 are performed first for one of the semiconducting substrates before some or all of steps 321 through 329 are performed for the other semiconducting substrate.

Step 321 of method 300 is to form a mask layer on the semiconducting substrate. In one embodiment, the mask layer can be a hard mask similar to a hard mask 420 that is shown in FIG. 4. As an example, hard mask 420 can be a nitride hard mask or the like. Accordingly, in one embodiment, step 321 comprises forming a hard mask comprising nitride. In another embodiment, the mask layer can be a resist mask or a spin-on-glass (SOG) mask, a polyimide mask, or the like.

The type of mask formed in step 321 depends at least in part on the type of etch performed in a subsequent step of method 300, further discussed below, in order to form a trench in the substrate. If the etch to be performed in that subsequent step is a wet etch, the mask layer formed in step 321 should be a hard mask. If the etch to be performed in that subsequent step is a dry etch, the mask layer formed in step 321 can be the same as or similar to one of the other masks mentioned above.

Step 322 of method 300 is to pattern and etch the mask layer using a photoresist layer or the like in order to expose a portion of the semiconducting substrate. In one embodiment, the photoresist layer can be similar to a trace mask or photoresist layer 430 that is shown in FIG. 4. As illustrated by FIG. 4, photoresist layer 430 has been patterned, exposed, and developed in such a way as to expose a portion of hard mask 420. The exposed portion of hard mask 420 has then been removed using an etching process or the like, thereby exposing a portion 421 of semiconducting substrate 410.

Step 323 of method 300 is to remove the photoresist layer or similar layer. Various techniques for removing a photoresist layer are known in the art. As an example, the photoresist layer may be removed using a solvent resist strip, ashing, a plasma etch, a wet clean, or the like, or some combination of the foregoing or similar methods.

Step 324 of method 300 is to etch the portion of the semiconducting substrate in order to form a trench in the semiconducting substrate. The size of the trench may be adjusted as desired by adjusting, for example, the size of portion 421, the duration of the etch, or one or more other etch parameters as further detailed below. In one embodiment, step 324 comprises isotropically etching the semiconducting substrate in order to form a hemispherical or substantially hemispherical trench.

Step 324 can comprise either a wet etch or a dry etch. As an example, the wet etch can comprise an etch performed using a mixture of hydrofluoric acid, nitric acid, and acetic acid (commonly designated by the acronym HNA) or the like. As another example, the dry etch can be performed using sulfur hexafluoride ($SF_6$) or the like.

If step 324 comprises a wet etch, the size of the trench may be adjusted by, in addition to the techniques listed above, adjusting the type and/or the concentration of the chemical used in the etch and/or the temperature at which the etch is performed. If step 324 comprises a dry etch, the size of the trench may be adjusted by, in addition to the techniques listed above, adjusting the type of the gas or gas plasma used for the etch, adjusting the flow rate of the gas or gas plasma, adjusting the coil power, and/or adjusting the platen power.

Figure 5:
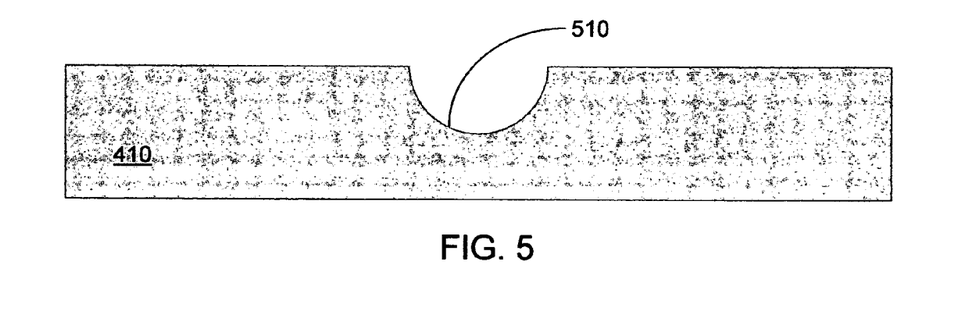
FIG. 5 is a cross sectional view, depicting a different point in a manufacturing process, of an environment useful in the manufacture of a portion of a coaxial trace according to an embodiment of the invention.

As another example, the trench can be similar to a trench 510, first shown in FIG. 5. FIG. 5 is a cross sectional view, depicting a particular point in the manufacturing process of method 300, of an environment useful in the manufacture of a coaxial trace according to an embodiment of the invention.

Step 325 of method 300 is to remove the mask layer. Note that hard mask 420 does not appear in FIG. 5. The reason is that hard mask 420 has been removed prior to the point in the manufacturing process that is depicted in FIG. 5.

Various techniques for removing a mask layer are known in the art. For example, if the mask layer is a hard mask it may be removed using hot phosphoric acid ($H_3PO_4$) or the like. If the mask layer is a resist mask, an SOG mask, a polyimide mask, or the like then it may be removed using a solvent resist strip, an ashing process, a plasma etch, a wet clean process, or the like.

Step 326 of method 300 is to form a first dielectric layer in the trench. As an example, the first dielectric layer can be similar to layer 110 of electrically insulating material and/or layer 130 of electrically insulating material, both of which were first shown in FIG. 1. As another example, the first dielectric layer can be similar to a dielectric layer 610, first shown in FIG. 6.

Figure 6:
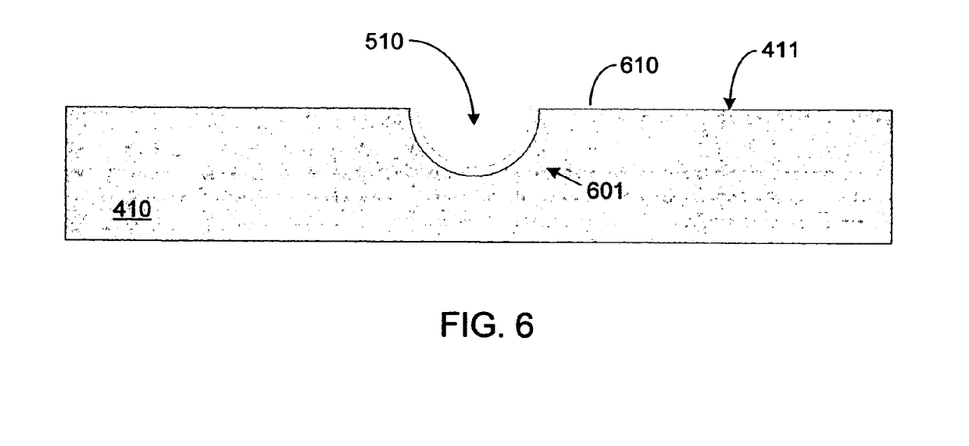
FIG. 6 is a cross sectional view depicting a different point in a manufacturing process of a portion of a coaxial trace, together with an environment useful in its manufacture, according to an embodiment of the invention.

FIG. 6 is a cross sectional view of a portion 601 of a coaxial trace, together with an environment useful in its manufacture, at a particular point in the manufacturing process according to an embodiment of the invention. As an example, portion 601 can be similar to portion 101 of coaxial trace 100, both of which were shown in FIG. 1.

As mentioned above, FIG. 6 illustrates dielectric layer 610, which can be similar to layer 110 of electrically insulating material that was shown in FIG. 1. Accordingly, in one embodiment, step 326 comprises forming a silicon dioxide layer. In the same or another embodiment, step 326 comprises depositing the first dielectric layer over a surface of the semiconducting substrate and in the trench and then removing the first dielectric layer from the surface of the semiconducting substrate while leaving the first dielectric layer in the trench. In the embodiment illustrated in FIG. 6, for example, dielectric layer 610 has been formed not only in trench 510 but also on all or substantially all of surface 411. It should be understood that when a layer is described herein as being formed on a surface and in a trench and then as being removed from the surface, the layer being described is not removed from the trench but rather is left in place in the trench.

In the same or another embodiment, removing the first dielectric layer comprises polishing the first dielectric layer back to the surface of the semiconducting substrate using the surface of the semiconducting substrate as an etch stop layer. As an example, such polishing may comprise a chemical mechanical polishing (CMP) process. Advantageously, there exist CMP slurries that will plane both copper and silicon dioxide at the same rate.

Step 327 of method 300 is to form a first electrically conducting layer over the first dielectric layer. As an example, the first electrically conducting layer can be similar to layer 120 of electrically conducting material, first shown in FIG. 1. As another example, the first electrically conducting layer can be similar to an electrically conducting layer 710, first shown in FIG. 7.

In one embodiment, step 327, step 326, or a separate step can comprise forming a first seed layer over the first electrically insulating layer such that the first seed layer is located between the first electrically insulating layer and the first electrically conducting layer. As an example, the first seed layer can be similar to seed layer 119, first shown in FIG. 1. As mentioned above, the first seed layer is not shown in any of FIGS. 4-10 in order to avoid obscuring the other details of the illustrated coaxial trace.

Figure 7:
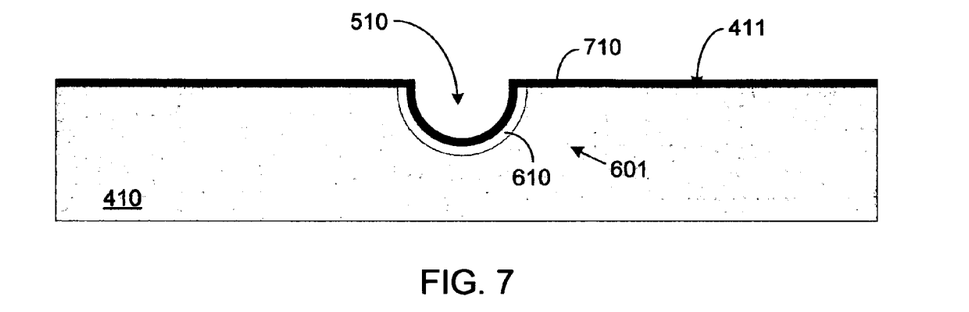
FIG. 7 is a cross sectional view depicting a different point in a manufacturing process of the portion of the coaxial trace, together with an environment useful in its manufacture, according to an embodiment of the invention.
Figure 8:
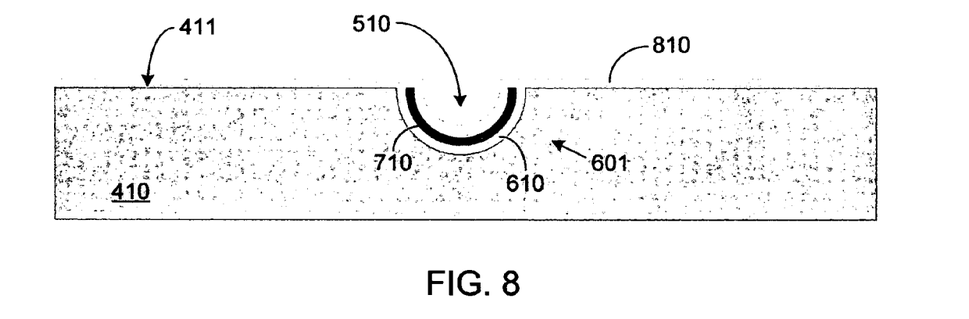
FIG. 8 is a cross sectional view depicting a different point in a manufacturing process of the portion of the coaxial trace, together with an environment useful in its manufacture, according to an embodiment of the invention.

FIG. 7 is a cross sectional view of portion 601 of the coaxial trace, together with an environment useful in its manufacture, at a particular point in the manufacturing process according to an embodiment of the invention. As mentioned above, FIG. 7 depicts electrically conducting layer 710, which can be similar to layer 120 of electrically conducting material that was shown in FIG. 1. Accordingly, in one embodiment, step 327 comprises forming a copper layer. In the same or another embodiment, step 327 comprises depositing the first electrically conducting layer over a surface of the semiconducting substrate and in the trench and then removing the first electrically conducting layer from the surface of the semiconducting substrate. In the embodiment illustrated in FIG. 7, for example, electrically conducting layer 710 has been formed not only in trench 510 but also on all or substantially all of surface 411. As an example, removing the first electrically conducting layer can comprise polishing the first electrically conducting layer back to the surface of the semiconducting substrate, such as with a CMP procedure.

Step 328 of method 300 is to form a second dielectric layer over the first electrically conducting layer. The second dielectric layer may or may not be similar to the first dielectric layer. As an example, the second dielectric layer can be similar to layer 130 of electrically insulating material, first shown in FIG. 1. As another example, the second dielectric layer can be similar to a dielectric layer 810, first shown in FIG. 8, which is a cross sectional view of portion 601 of the coaxial trace, together with an environment useful in its manufacture, at a particular point in the manufacturing process according to an embodiment of the invention.

As mentioned above, FIG. 8 illustrates dielectric layer 810, which can be similar to layer 130 of electrically insulating material that was shown in FIG. 1. Accordingly, in one embodiment, step 328 comprises forming a silicon dioxide layer. In the same or another embodiment, step 328 comprises depositing the second dielectric layer over a surface of the semiconducting substrate and in the trench and then removing the second dielectric layer from the surface of the semiconducting substrate. In the embodiment illustrated in FIG. 8, for example, dielectric layer 810 has been formed not only in trench 510 but also on all or substantially all of surface 411. Both of, one of, or neither of steps 326 and 328 may be carried out in the stated fashion.

Step 329 of method 300 is to form a second electrically conducting layer over the second dielectric layer such that the trench is substantially full. The second electrically conducting layer may or may not be similar to the first electrically conducting layer.

In one embodiment, step 329, step 328, or a separate step can comprise forming a second seed layer over the second electrically insulating layer such that the second seed layer is located between the second electrically insulating layer and the second electrically conducting layer. As an example, the second seed layer can be similar to seed layer 139, first shown in FIG. 1. Like the first seed layer, the second seed layer is not shown in any of FIGS. 4-10 in order to avoid obscuring the other details of the illustrated coaxial trace.

As an example, the second electrically conducting layer can be similar to layer 140 of electrically conducting material, first shown in FIG. 1. As another example, the second electrically conducting layer can be similar to an electrically conducting layer 910, first shown in FIG. 9, which is a cross sectional view of portion 601 of the coaxial trace, together with an environment useful in its manufacture, at a particular point in the manufacturing process according to an embodiment of the invention. As mentioned above, FIG. 9 illustrates electrically conducting layer 910, which can be similar to layer 140 of electrically conducting material that was shown in FIG. 1. Accordingly, in one embodiment, step 329 comprises forming a copper layer.

Figure 9:
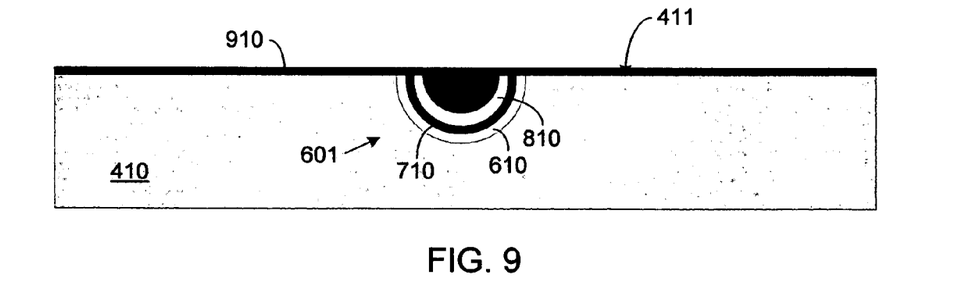
FIG. 9 is a cross sectional view depicting a different point in a manufacturing process of the portion of the coaxial trace, together with an environment useful in its manufacture, according to an embodiment of the invention.

In one embodiment, step 329 comprises sputtering a quantity of electrically conducting material sufficient to fill the trench. In a different embodiment, step 329 comprises depositing a metal or other electrically conducting layer over the surface of the semiconducting substrate and in the trench and then electroplating the metal or other electrically conducting layer so as to fill or substantially fill the trench. Copper, for example, may be electroplated relatively easily. In either embodiment, as is the case with other possible embodiments not explicitly described herein, the end result of step 329 is that trench 510 is filled or substantially filled with an electrically conducting material, as illustrated in FIG. 9. In one embodiment, step 329 or a subsequent step comprises removing, such as with a CMP process, the electrically conducting material from the surface of the semiconducting substrate, thus leaving the electrically conducting material only in the trench.

Figure 10:
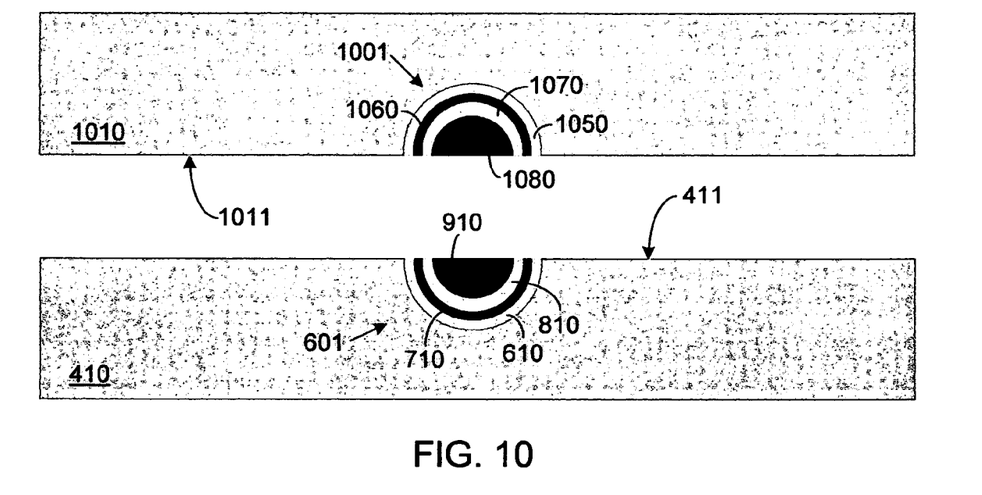
FIG. 10 is a cross sectional view depicting a different point in a manufacturing process of the portion of the coaxial trace, together with another portion of the coaxial trace and an environment useful in their manufacture, according to an embodiment of the invention.

A step 330 of method 300 is to align the first semiconducting substrate and the second semiconducting substrate to each other. Step 330 is illustrated by FIG. 10, which is a cross sectional view of portion 601 of the coaxial trace, together with a portion 1001 of the coaxial trace and an environment useful in their manufacture, at a particular point in the manufacturing process according to an embodiment of the invention. As illustrated in FIG. 10, portion 1001 of the coaxial trace comprises a semiconducting substrate 1010, a dielectric layer 1050, an electrically conducting layer 1060 interior to dielectric layer 1050, a dielectric layer 1070 interior to electrically conducting layer 1060, and an electrically conducting layer 1080 interior to dielectric layer 1070.

As an example, semiconducting substrate 1010 can be similar to section 192 of semiconducting substrate 190. As another example, dielectric layers 1050 and 1070 and electrically conducting layers 1060 and 1080 can be similar to, respectively, dielectric layers 610 and 810 and electrically conducting layers 710 and 910, shown in one or more of FIGS. 6-9. As yet another example, dielectric layers 1050 and 1070 and electrically conducting layers 1060 and 1080 can be similar to, respectively, layers 150 and 170 of electrically insulating material and layers 160 and 180 of electrically conducting material, all of which were shown in FIG. 1.

In at least one embodiment, portion 1001 of the coaxial trace is manufactured using a method of manufacture that is the same as or similar to method 300 (see FIG. 3). Following such manufacture, whether by method 300, a similar method, or some other method, portion 1001 and portion 601 are brought together and, in one embodiment, step 330 is performed in order to align them with each other. Such alignment results, in the illustrated embodiment, in the alignment with each other not only of semiconducting substrates 410 and 1010 but also of dielectric layers 610 and 1050, electrically conducting layers 710 and 1060, dielectric layers 810 and 1070, and electrically conducting layers 910 and 1080, as well as corresponding pairs of seed layers that were described above but not illustrated in FIGS. 4-10.

A step 340 of method 300 is to bond the first semiconducting substrate and the second semiconducting substrate to each other. In one embodiment, step 340 comprises annealing the first semiconducting substrate and the second semiconducting substrate so as to fuse the first semiconducting substrate and the second semiconducting substrate to each other. The result of the performance of step 340 is the creation of a coaxial trace that is, in at least one embodiment, substantially similar to coaxial trace 100, shown in FIG. 1. When comparing FIG. 10 to FIG. 1, however, keep in mind that, as mentioned above, for reasons of clarity and simplicity the seed layers have been omitted from FIG. 10.

With continued reference to FIG. 1, in some embodiments a seam may be detectable at or near bond line 199 between sections 191 and 192 of semiconducting substrate 190. The same or a similar seam may also be detectable between layers 150 and 170 of electrically insulating material and/or between layers 160 and 180 of electrically conducting material. Nevertheless, provided that the surfaces are substantially co-planar prior to bonding an intimate surface contact should be provided such that the interface between layers 150 and 170, layers 160 and 180, and sections 191 and 192 should fuse during the bonding process. Subsequently, each pair of fused materials should act as a single contiguous piece of, respectively, silicon dioxide, copper, and silicon, or a single contiguous piece of whatever material is used for the separate pieces before such bonding takes place.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the coaxial trace and the manufacturing method discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A method of manufacturing a coaxial trace within a surrounding material, the method comprising:
   providing a first substrate composed of the surrounding material and a second substrate composed of the surrounding material;
   forming a first portion of the coaxial trace in the first substrate;
   forming a second portion of the coaxial trace in the second substrate;
   aligning the first portion of the coaxial trace and the second portion of the coaxial trace with each other; and
   bonding the first portion of the coaxial trace and the second portion of the coaxial trace to each other.

2. The method of claim 1 wherein:
   aligning the first portion of the coaxial trace with the second portion of the coaxial trace comprises:
      inverting one of the first portion and the second portion with respect to the other one of the first portion and the second portion to create an inverted portion and a non-inverted portion; and
      placing the inverted portion above the non-inverted portion such that a feature of the inverted portion is aligned with a corresponding feature of the non-inverted portion.

3. The method of claim 1 wherein:
   forming the first portion of the coaxial trace comprises:
      forming a first electrically insulating layer in the first substrate;
      forming a first electrically conducting layer interior to the first electrically insulating layer;
      forming a second electrically insulating layer interior to the first electrically conducting layer; and
      forming a second electrically conducting layer interior to the second electrically insulating layer; and
   forming the second portion of the coaxial trace comprises:
      forming a third electrically insulating layer in the second substrate;
      forming a third electrically conducting layer interior to the third electrically insulating layer;
      forming a fourth electrically insulating layer interior to the third electrically conducting layer; and
      forming a fourth electrically conducting layer interior to the third electrically insulating layer.

4. The method of claim 3 wherein:
   bonding the first portion of the coaxial trace to the second portion of the coaxial trace comprises fusing the first substrate to the second substrate.

5. The method of claim 4 wherein:
   bonding the first portion of the coaxial trace to the second portion of the coaxial trace further comprises:
      fusing the first electrically insulating layer and the third electrically insulating layer to each other;
      fusing the first electrically conducting layer and the third electrically conducting layer to each other;
      fusing the second electrically insulating layer and the fourth electrically insulating layer to each other; and
      fusing the second electrically conducting layer and the fourth electrically conducting layer to each other.

6. The method of claim 5 wherein:
   the surrounding material comprises silicon.

7. A method of manufacturing a coaxial trace in a semiconducting material, the method comprising:
   providing a first semiconducting substrate and a second semiconducting substrate;
   for both the first semiconducting substrate and the second semiconducting substrate:
      forming a mask layer on the semiconducting substrate;
      patterning and etching the mask layer using a photoresist layer in order to expose a portion of the semiconducting substrate;
      removing the photoresist layer;
      etching the portion of the semiconducting substrate in order to form a trench in the semiconducting substrate;
      removing the mask layer;
      forming a first dielectric layer in the trench;
      forming a first electrically conducting layer over the first dielectric layer;
      forming a second dielectric layer over the first electrically conducting layer; and
      forming a second electrically conducting layer over the second dielectric layer such that the trench is substantially full;
   aligning the first semiconducting substrate and the second semiconducting substrate to each other; and
   bonding the first semiconducting substrate and the second semiconducting substrate to each other.

8. The method of claim 7 further comprising:
   for both the first semiconducting substrate and the second semiconducting substrate:
      forming a first seed layer prior to forming the first electrically conducting layer; and
      forming a second seed layer prior to forming the second electrically conducting layer.

9. The method of claim 8 wherein:
   forming the seed layer comprises forming a layer comprising a material selected from the group consisting of titanium, titanium nitride, tantalum, tantalum nitride, and tungsten.

10. The method of claim 7 wherein:
    providing the first semiconducting substrate and the second semiconducting substrate comprises providing a first silicon substrate and a second silicon substrate.

11. The method of claim 10 wherein:
    forming the mask layer comprises forming a nitride hard mask.

12. The method of claim 10 wherein:
    forming the mask layer comprises forming one of a resist layer, a spin-on-glass mask, and a polyimide mask.

13. The method of claim 10 wherein:
    at least one of forming the first dielectric layer and forming the second dielectric layer comprises forming a layer of silicon dioxide.

14. The method of claim 10 wherein:
    at least one of forming the first electrically conducting layer and forming the second electrically conducting layer comprises forming a layer of copper.

15. The method of claim 7 wherein:
    etching the portion of the semiconducting substrate comprises isotropically etching the semiconducting substrate such that the trench that is formed is a substantially hemispherical trench.

16. The method of claim 7 wherein:
    forming at least one of the first dielectric layer and the second dielectric layer comprises:
       depositing the at least one of the first dielectric layer and the second dielectric layer over a surface of the semiconducting substrate and in the trench; and removing the at least one of the first dielectric layer and the second dielectric layer from the surface of the semiconducting substrate.

17. The method of claim 16 wherein:
removing the at least one of the first dielectric layer and the second dielectric layer comprises polishing the at least one of the first dielectric layer and the second dielectric layer back to the surface of the semiconducting substrate.

18. The method of claim 7 wherein:
forming the first electrically conducting layer comprises:
  depositing the first electrically conducting layer over a surface of the semiconducting substrate and in the trench; and
  removing the first electrically conducting layer from the surface of the semiconducting substrate.

19. The method of claim 18 wherein:
removing the first electrically conducting layer comprises polishing the first electrically conducting layer back to the surface of the semiconducting substrate.

20. The method of claim 18 wherein:
forming the second electrically conducting layer comprises sputtering a quantity of electrically conducting material sufficient to fill the trench.

21. The method of claim 18 wherein:
forming the second electrically conducting layer comprises:
  depositing a metal layer over the surface of the semiconducting substrate and in the trench; and
  electroplating the metal layer so as to fill or substantially fill the trench.

22. The method of claim 7 wherein:
bonding the first semiconducting substrate and the second semiconducting substrate to each other comprises annealing the first semiconducting substrate and the second semiconducting substrate so as to fuse the first semiconducting substrate and the second semiconducting substrate to each other.

* * * * *